United States Patent [19]
Kishi

[11] Patent Number: 5,958,076
[45] Date of Patent: Sep. 28, 1999

[54] SEMICONDUCTOR INTEGRATED CIRCUIT

[75] Inventor: Tetsuji Kishi, Osaka, Japan

[73] Assignee: Matsushita Electric Industrial Co., Ltd., Osaka, Japan

[21] Appl. No.: 08/959,159

[22] Filed: Oct. 28, 1997

[30] Foreign Application Priority Data

Oct. 29, 1996 [JP] Japan ................................. 8-286353

[51] Int. Cl.$^6$ ................................................ G01R 31/28
[52] U.S. Cl. ............................................ 714/726; 714/30
[58] Field of Search ........................... 371/22.33, 22.31, 371/22.32, 22.35, 22.5, 27.5; 395/183.06, 183.13, 183.19, 183.2; 364/489, 490; 324/756; 326/83, 86, 38; 714/5, 27, 30, 37, 39, 43, 726, 727, 733

[56] References Cited

U.S. PATENT DOCUMENTS

| | | | |
|---|---|---|---|
| 5,220,281 | 6/1993 | Koji | 324/158 R |
| 5,561,614 | 10/1996 | Revilla et al. | 364/579 |
| 5,656,953 | 8/1997 | Whetsel | 326/83 |
| 5,706,296 | 1/1998 | Whetsel | 371/22.1 |
| 5,710,779 | 1/1998 | Whetsel | 371/22.3 |
| 5,715,254 | 2/1998 | Whetsel | 371/22.3 |
| 5,732,091 | 3/1998 | Whetsel | 371/22.3 |

FOREIGN PATENT DOCUMENTS

| | | |
|---|---|---|
| 02130847 | 5/1990 | Japan . |
| 05072294 | 3/1993 | Japan . |
| 07128406 | 5/1995 | Japan . |

*Primary Examiner*—Robert W. Beausoliel, Jr.
*Assistant Examiner*—Nadeem Iqbal
*Attorney, Agent, or Firm*—McDermott, Will & Emery

[57] ABSTRACT

A test unit for testing a random logical circuit and a functional macrocircuit according to a scan test mode signal and a macro test mode signal is provided. The test unit includes a first and a second bidirectional I/O module. Whereas the first bidirectional I/O module is a module for providing a macro test output signal outside or providing a scan test input signal to the random logical circuit, and in addition, for performing input/output processing of a first normal input signal and a first normal output signal with respect to the random logical circuit, the second bidirectional I/O module is a module for providing a macro test input signal to the functional macrocircuit or providing a scan test output signal outside, and in addition, for performing input/output processing of a second normal input signal and a second normal output signal with respect to the random logical circuit.

6 Claims, 3 Drawing Sheets

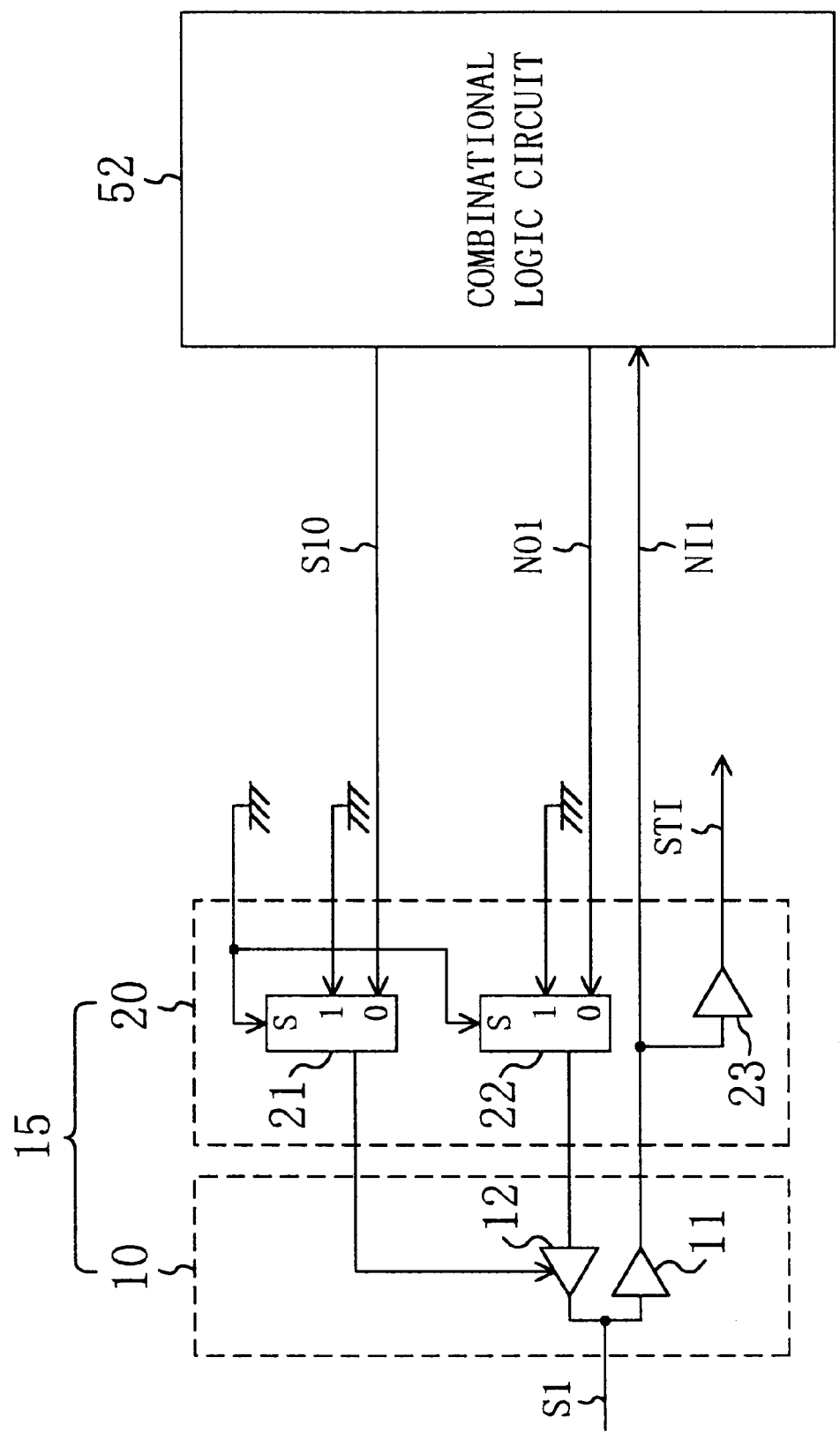

SEMICONDUCTOR INTEGRATED CIRCUIT

FIELD OF THE PRESENT INVENTION

The present invention relates in general to semiconductor integrated circuits, and more particularly, to a semiconductor integrated circuit of large-scale integration that is designed to be testable without the increase of chip area.

BACKGROUND OF THE PRESENT INVENTION

The internal functions of recent large-scale integrated circuits have become more and more sophisticated. Since large-scale integrated circuits contain therein a combinational logic circuit and a plurality of functional macrocircuits having a specified function, this dramatically increases the number of circuit elements contained in large-scale integrated circuits. Memory, DAC (digital-to-analog converter), or the like component is used as the functional macrocircuit. As the internal function of large-scale integrated circuits becomes elaborate, the functional testing thereof becomes difficult to perform. In testing a large-scale integrated circuit for its functions, both the controllability of externally controlling portions to be tested and the ovservability of externally observing a result of the test play an important role.

A basic manner of the function test is a test that is carried out using a specified test vector through test buses disposed to provide external control or observation of the internal state of portions of a large-scale integrated circuit. Scan testing is known as a function test technique for testing combinational logic circuits to achieve a high test coverage with a less test vector quantity. Such a scan test is composed of scan-in and scan-out, the scan-in using a test bus for the provision of data to the inside of a large-scale integrated circuit and the scan-out using another test bus for the observation of the data. On the other hand, macro testing is known as a technique for testing functional macrocircuits, in which the processing of inputting and outputting data is sequentially performed on a functional macrocircuit according to a given algorithm and the value of an output obtained is compared with a specified expected value for determining whether the functional macrocircuit is functioning correctly.

The above-described organization, however, suffers the following drawbacks. As the level of integration of random logical circuits becomes higher, the number of circuit elements increases thereby increasing the number of scan buses. As a result, both the number of scan-in terminals and the number of scan-out terminals increase. Additionally, not only because the number of functional macrocircuits is made to increase for improvements in performance, but also because of an expansion in address bus width and data bus width in cases where functional macrocircuits are formed by a memory, the numbers of macro-in and macro-out terminals increase. This requires a great number of input and output (I/O) terminals for test operation (i.e., scan-in terminals, scan-out terminals, macro-in terminals, and macro-out terminals), in addition to input and output (I/O) terminals for normal operation, therefore leading to an increase in chip area. With the speed-up of normal operations in semiconductor integrated circuit, it becomes necessary to achieve a reduction of the signal delay in I/O terminals for normal operation. In order to meet such a requirement as to the speed-up of normal operations, it is necessary to provide I/O terminals for normal operation capable of achieving a minimum signal delay independently of I/O terminals for test operation. This, however, results in a further increase in chip area because the total number of I/O terminals increases.

If I/O terminals are shared between normal operation and test operation, this will control the increase in chip area. However, in such a case, a route switch means of performing switching between a route at normal operation time and another at test operation time and another route switch means of performing switching between a route for scan test and another for macro test must be disposed on the input and output sides. This is a bar to the speed-up of operations.

SUMMARY OF THE PRESENT INVENTION

The present invention was made with a view to providing a solution to the above-noted problems with prior art technologies. Accordingly, an object of the present invention is as follows. In accordance with the present invention, I/O terminals for test operation and I/O terminals for normal operation are commonized, and in addition, I/O terminals for test operations of different types are also commonized, whereby the increase in chip area becomes controllable and an improved semiconductor integrated circuit having the ability to control the decrease in its operation rate can be realized.

In order to achieve the object, the present invention discloses a first semiconductor integrated circuit made up of a random logical circuit, a functional macrocircuit, these circuits being connected together, and a test unit that is a unit operable to perform scan and macro testing on the random logical circuit and on the functional macrocircuit, respectively. The test unit includes a first bidirectional I/O module and a second bidirectional I/O module. According to a macro test mode signal received, the first bidirectional I/O module either provides a macro test output signal received from the functional macrocircuit or a first normal output signal received from the random logical circuit to the outside or provides an input signal for use in scan test operation and a first normal input signal, both of which were received from without, to the random logical circuit. According to a scan test mode signal received, the second bidirectional I/O module either provides a scan test output signal or a second normal output signal, both of which were received from the random logical circuit, to the outside or provides a macro test input signal and a second normal input signal, both of which were received from without, to the functional macrocircuit and to the random logical circuit, respectively.

Such arrangement allows the first and second bidirectional I/O modules to secure, based on the macro and scan test mode signals received, signal routes for normal operation, macro test operation, and scan test operation. Accordingly, the test unit, formed of the first and second bidirectional I/O modules, exclusively secures necessary signal routes for scan test operation as well as for macro test operation, and in addition, secures a signal route for normal operation in order that the signal route may pass through a least number of selectors. The commonization of I/O terminals for use in testing of different types and I/O terminals for use in normal operation makes it possible to achieve not only a reduction of the chip area but also a reduction of the signal delay at normal operation time thereby controlling a drop in operation rate.

The present invention discloses a second semiconductor integrated circuit in which a stylized test unit, made up of a first and a second bidirectional I/O module of the present invention, is disposed in advance around the periphery of a chip. This facilitates execution of layout design including the test unit.

BRIEF DESCRIPTION OF THE DRAWINGS

FIG. 3 is a circuit diagram showing a modified form of a bidirectional I/O module contained in a semiconductor integrated circuit of the second embodiment of the present invention.

DETAILED DESCRIPTION OF THE PRESENT INVENTION

Figure 1:
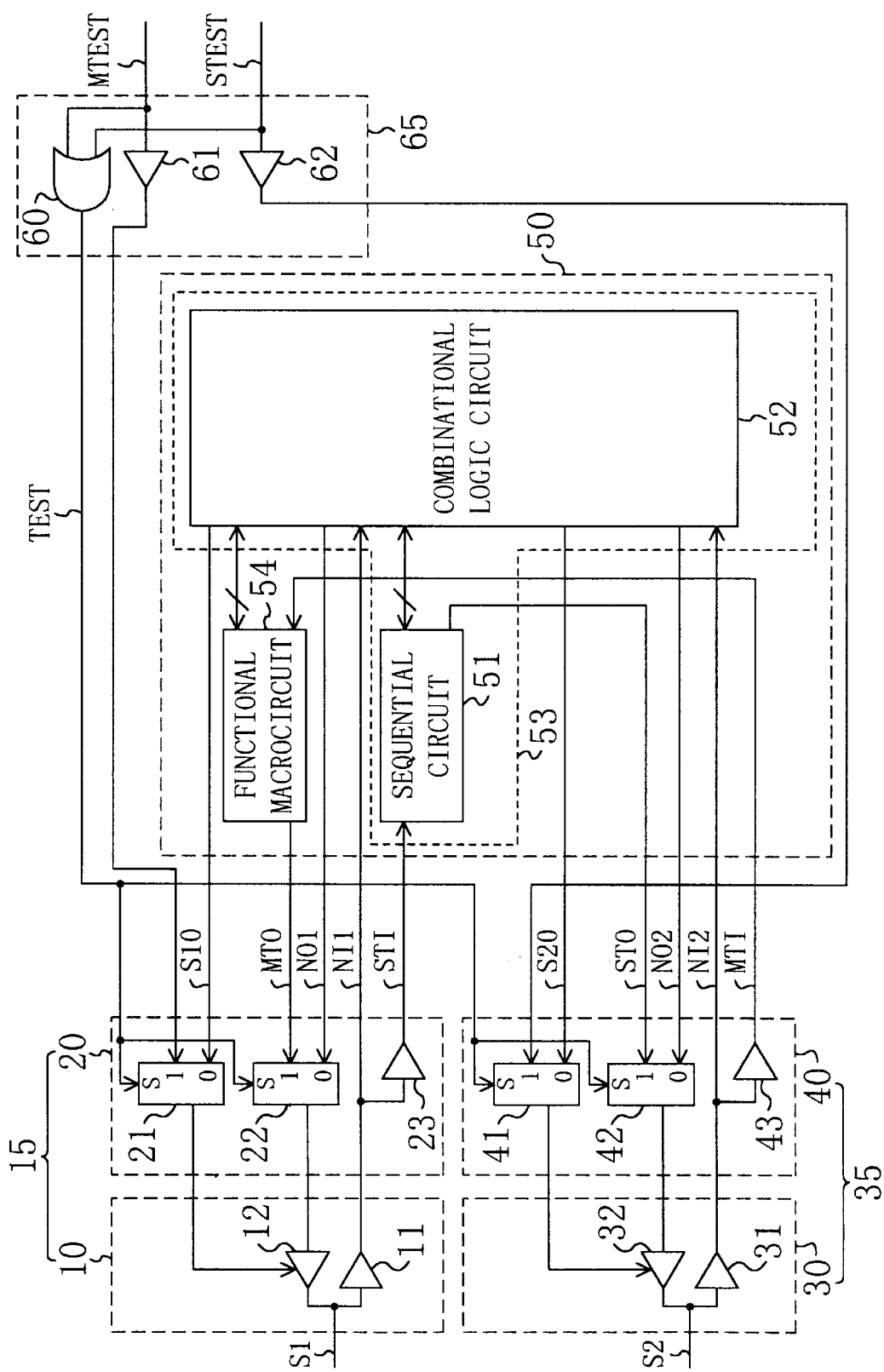
FIG. 1 is a circuit diagram showing an organization of a semiconductor integrated circuit constructed in accordance with a first embodiment of the present invention.

A first semiconductor integrated circuit of this invention is illustrated with reference to FIG. 1. A first bidirectional I/O module 15 and a second bidirectional I/O module 35 together constitute a test unit. The first bidirectional I/O module 15 is made up of a first bidirectional driver 10 and a first selection module 20. The first bidirectional driver 10 is made up of an input buffer 11 and an output buffer 12. The first selection module 20 is made up of a first selector 21, a second selector 22, and a buffer 23. The input buffer 11 is a buffer which receives a serial signal S1 from outside and provides a scan test input signal STI and a first normal input signal NI1. The output buffer 12 is a buffer operable to provide the serial signal S1 composed of a signal received from the second selector 22 to the outside, when a transmission control signal, received from the first selector 21, is in the state of "HIGH" (high level). The first selector 21 is a selection circuit which selects between a macro test mode signal MTEST and a first normal control signal S10 according to a test mode signal TEST received and provides a transmission control signal, composed of a signal selected (the signal MTEST or the signal S10, whichever is selected) to a transmission direction control terminal of the output buffer 12. The second selector 22 is a selection circuit which selects between a macro test output signal MTO and a first normal output signal NO1 according to the test mode signal TEST received and provides a signal selected (the signal MTO or the signal NO1, whichever is selected) to an input terminal of the output buffer 12. The buffer 23 is a buffer operable to provide the scan test input signal STI composed of a signal received from the input buffer 11.

The second bidirectional I/O module 35 is made up of a second bidirectional driver 30 and a second selection module 40. The second bidirectional driver 30 is made up of an input buffer 31 and an output buffer 32. The second selection module 40 is made up of a third selector 41, a fourth selector 42, and a buffer 43. The input buffer 31 is a buffer which receives a serial signal S2 from outside and provides a macro test input signal MTI and a second normal input signal NI2. The output buffer 32 is a buffer operable to provide the serial signal S2 composed of a signal received from the fourth selector 42 to the outside, when a transmission control signal, received from the third selector 41, is in the state of "HIGH". The third selector 41 is a selection circuit which selects between a scan test mode signal STEST and a second normal control signal S20 according to the test mode signal TEST received and provides a transmission control signal, composed of a signal selected (the signal STEST or the signal S20, whichever is selected) to a transmission direction control terminal of the output buffer 32. The fourth selector 42 is a selection circuit which selects between a scan test output signal STO and a second normal output signal NO2 according to the test mode signal TEST received and provides a signal selected (the signal STO or the signal NO2, whichever is selected) to an input terminal of the output buffer 32. The buffer 43 is a buffer operable to provide the macro test input signal MTI composed of a signal received from the input buffer 31.

50 is a functional module. The functional module 50 is a circuit as a test target. The functional module 50 is formed of a random logical circuit 53 and a functional macrocircuit 54 implemented by, for example, a memory. The random logical circuit 53 includes a sequential circuit 51 and a combinational logic circuit 52 as scan test targets. The sequential circuit 51 is a circuit which provides a parallel signal on the basis of the scan test input signal STI received from the buffer 23 and the scan test signal STO to the combinational logic circuit 52 and to the fourth selector 42, respectively at scan test time and establishes communication of signals with the combinational logic circuit 52 at normal operation time. The functional macrocircuit 54 is a circuit which receives the macro test input signal MTI from the buffer 43 and provides the macro test output signal MTO to the second selector 22 at macro test time and establishes communication of signals with the combinational logic circuit 52 at normal operation time. The combinational logic circuit 52 is a circuit which receives a parallel signal on the basis of the scan test input signal STI through the sequential circuit 51 and provides a parallel signal, which is a result of the operation, to the sequential circuit 51 at scan test time. At normal operation time, the combinational logic circuit 52 receives the first and second normal input signals NI1 and NI2 from the buffers 11 and 31, respectively and provides the first and second normal output signals NO1 and NO2.

65 is a test signal selection module. The test signal selection module 65 has an OR gate 60, a buffer 61, and a buffer 62. The OR gate 60 is a logical gate which receives the macro test mode signal MTEST and the scan test mode signal STEST and provides the test mode signal TEST. The buffer 61 is a buffer operable to receive and provide the macro test mode signal MTEST, whereas the buffer 62 is a buffer operable to receive and provide the scan test mode signal STEST.

The operation of the semiconductor integrated circuit shown in FIG. 1 is now explained. At the time of performing a scan test, the scan test mode signal STEST is set at "HIGH" while the macro test mode signal MTEST is at "LOW", as a result of which the test mode signal TEST enters the "HIGH" state. Then the first selector 21 provides the macro test mode signal MTEST of "LOW" to the transmission direction control terminal of the output buffer 12, and the second selector 22 provides the macro test output signal MTO to the input terminal of the output buffer 12. Since the macro test mode signal MTEST, received as a transmission direction control signal, is in the state of "LOW", the output buffer 12 does not provide the received macro test output signal MTO to outside. In such a case, the input buffer 11 provides the serial signal S1 received from outside to the buffer 23. The buffer 23 then provides the scan test input signal STI composed of the received serial signal S1 to the sequential circuit 51.

The sequential circuit 51 performs a shift operation on the received scan test input signal STI and provides a parallel signal, composed of the shifted signal, to the combinational logic circuit 52. The combinational logic circuit 52 carries out a specified operation and provides to the sequential circuit 51 a parallel signal composed of a signal output after the operation. The sequential circuit 51 performs serial conversion of the parallel signal received from the combinational logic circuit 52 and then provides to the fourth selector 42 the scan test output signal STO composed of the converted signal. Because the test mode signal TEST is in the state of "HIGH", the fourth selector 42 provides the scan test output signal STO to the input terminal of the output buffer 32, and in addition, the third selector 41 provides the scan test mode signal STEST of "HIGH" to the transmission direction control terminal of the output buffer 32. Since the scan test mode signal STEST, received as a transmission direction control signal, is in the state of "HIGH", the output buffer 32 provides the serial signal S2 composed of the received scan test output signal STO. Making a comparison between a specified expected value on the basis of the scan test input signal STI and the scan test output signal STO makes it possible to determine whether the sequential circuit 51 and the combinational logic circuit 52 are functioning correctly.

On the other hand, at the time of performing a macro test, the macro test mode signal MTEST is set at "HIGH" and the scan test mode signal STEST is set at "LOW". As a result of such setting, the test mode signal TEST enters the "HIGH" state. Accordingly, whereas the third selector 41 provides the scan test mode signal STEST of "LOW" to the transmission direction control terminal of the output buffer 32, the fourth selector 42 provides the scan test output signal STO to the input terminal of the output buffer 32. Since the scan test mode signal STEST, received as a transmission direction control signal, is in the state of "LOW", the output buffer 32 does not provide the received scan test output signal STO to the outside. In such a case, the input buffer 31 provides to the buffer 43 the serial signal S2 received from without and the buffer 43 provides the macro test input signal MTI, composed of the received serial signal S2, to the functional macrocircuit 54. The functional macrocircuit 54 carries out a specified operation and then provides the macro test output signal MTO, composed of a signal output after the operation, to the second selector 22. Because the test mode signal TEST is in the state of "HIGH", the second selector 22 provides the macro test output signal MTO to the input terminal of the output buffer 12 and the first selector 21 provides the macro test mode signal MTEST of "HIGH" to the transmission direction control terminal of the output buffer 12. Since the macro test mode signal MTEST, received as a transmission direction control signal from the first selector 21, is in the state of "HIGH", the output buffer 12 provides the serial signal S1, composed of the received macro test output signal MTO, to the outside. Making a comparison between a specified expected value on the basis of the macro test input signal MTI and the macro test output signal MTO makes it possible to determine whether the functional macrocircuit 54 is functioning correctly.

At the time of performing normal operations, both the macro test mode signal MTEST and the scan test mode signal STEST are set at "LOW". As a result of such setting in level, the test mode signal TEST enters the state of "LOW". In this case, the first selector 21 provides the received first normal control signal S10 to the transmission direction control terminal of the output buffer 12. The first bidirectional driver 10 provides the first normal input signal NI1, composed of the serial signal S1 received from without, to the combinational logic circuit 52, when the first normal control signal S10, received by the output buffer 12 through the first selector 21, is in the state of "LOW". The combinational logic circuit 52 performs a specified operation on the received first normal input signal NI1 and establishes communication of signals with the functional macrocircuit 54 as necessity requires. The fist bidirectional driver 10 provides the first normal output signal NO1, received from the combinational logic circuit 52 through the second selector 22, to outside, when the first normal control signal S10, received by the output buffer 12 through the first selector 21, is in the state of "HIGH".

The third selector 41 provides the received second normal control signal S20 to the transmission direction control terminal of the output buffer 32. When the second normal control signal S20, received by the output buffer 32 through the third selector 41, is in the state of "LOW", the second bidirectional driver 30 provides the second normal input signal NI2, composed of the serial signal S2 received from outside, to the combinational logic circuit 52. When the second normal control signal S20, received by the output buffer 32 through the third selector 41, is in the state of "HIGH", the second bidirectional driver 30 provides the second normal output signal NO2, received from the combinational logic circuit 52 through the fourth selector 42, to the outside.

As describe above, in accordance with the present embodiment the test unit, made up of the first and second bidirectional I/O modules 15 and 35, secures signal routes necessary for scan test, macro test, and normal operation. In the present invention, the I/O terminals for normal operation and the I/O terminals for test operation are commonized, whereby layout design of semiconductor integrated circuits can be carried out while controlling the increase in chip area. Additionally, the routing of normal input and output signals is arranged to pass through only one selector, which makes it possible to control the drop in operation rate.

Figure 2:
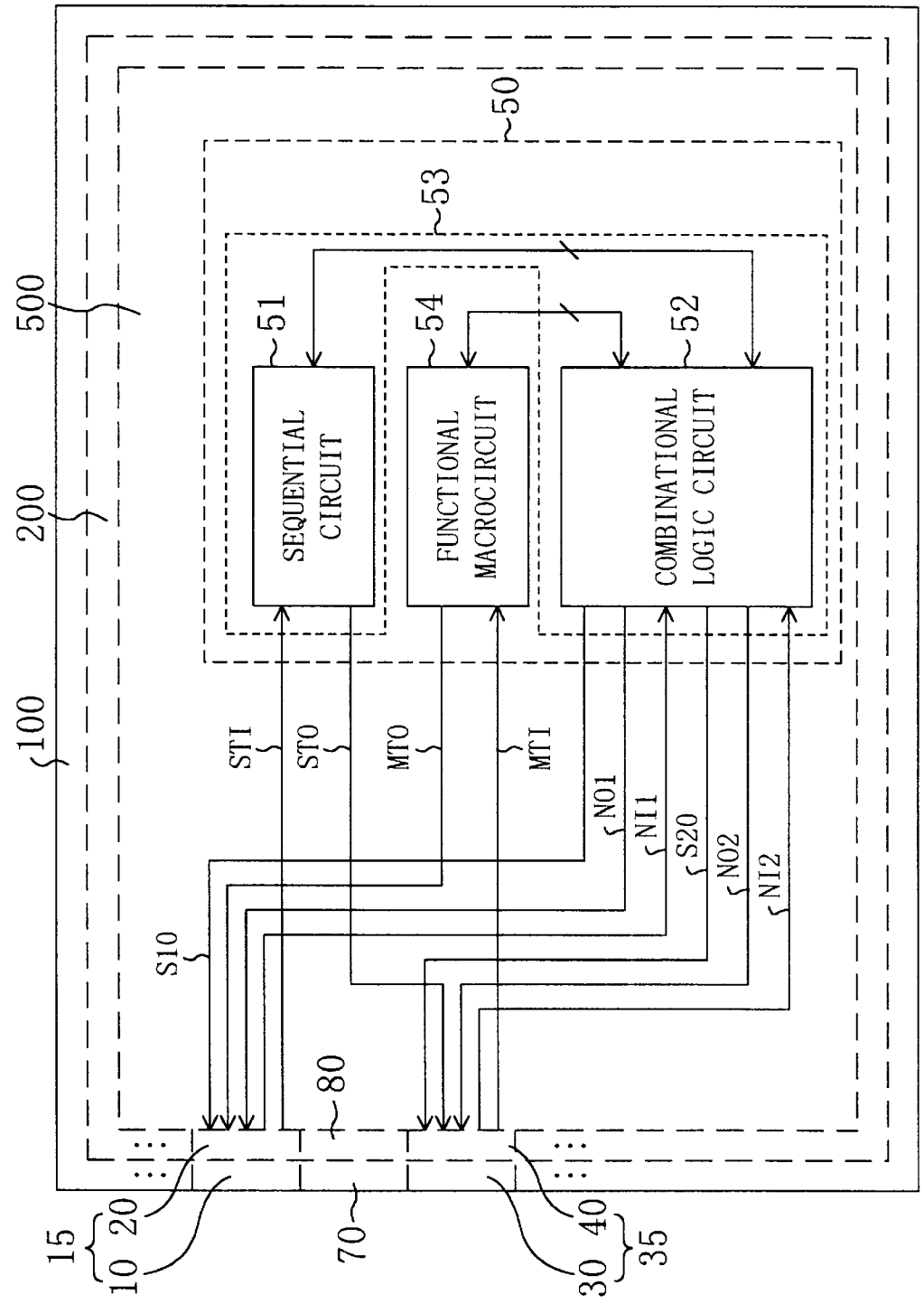
FIG. 2 is a block diagram showing an organization of a chip for a semiconductor integrated circuit constructed in accordance with a second embodiment of the present invention.

FIG. 2 depicts in block form a second semiconductor integrated circuit of the present invention, wherein the same reference numerals have been used to indicate like elements of the semiconductor integrated circuit of the second embodiment, such elements not being described here. The first bidirectional driver 10, the second bidirectional driver 30, and so on together form a bidirectional driver block 100. The first selection module 20, the second selection module 40, and so on together form a selection block 200. A single or more functional modules, composed of the functional module(s) 50, together form a functional block 500. Each of the first bidirectional I/O module 15 formed of the first bidirectional driver 10 and the first selection module 20, the second bidirectional I/O module 35 formed of the second bidirectional driver 30 and the second selection module 40, and so on constitutes a single test module stylized. Each of these stylized test modules has the same circuit configuration. Test units, each of which is formed of two bidirectional I/O modules, are disposed around the periphery of the semiconductor integrated circuit chip, as a result of which test modules having the same circuit configuration are arranged around the periphery of the chip. By suitable allocation of the disposed test units to the functional modules 50 forming the functional block 500, the layout design of a semiconductor integrated circuit is performed. Concretely, an input signal to the random logical circuit 53 and an output signal from the functional macrocircuit 54 form a pair and an output signal from the random logical circuit 53 and an input signal to the functional macrocircuit 54 form a pair, wherein these signal pairs are allocated to each of the test modules disposed. In FIG. 2, such allocation is carried out as follows. That is, the scan test input signal STI to the random logical circuit 53 and the macro test output signal MTO from the functional macrocircuit 54 are allocated, as a pair of signals, to the first bidirectional I/O module 15, and the scan test output signal STO from the random logical circuit 53 and the macro test input signal MTI to the functional macrocircuit 54 are allocated, as a pair of signals, to the second bidirectional I/O module 35. If there are test modules in excess, the regions, originally intended for the placement of bidirectional drivers and selection modules, then becomes circuit non-forming regions 70 and 80. To sum up, stylized test units are arranged around the periphery of a chip, which makes it possible to allocate test I/O signals of functional units contained in the functional module 500 for the stylized test units in order to deal with any of scan test operation, macro test operation, and normal operation.

FIG. 3 is a circuit diagram of a modified form of the bidirectional I/O module of the semiconductor integrated circuit in accordance with the present embodiment. In some cases, the scan test's bus bitwidth differs from that of the macro test depending on the organization of functional units used. Even in such a case, a test module is assigned a signal pair of a test input signal selected from a circuit which is a target for scan test and a test output signal selected from a circuit which is a target for macro test. Combinations of test input signals and test output signals held by the remaining test target circuits are allocated to respective test units. FIG. 3 shows a case in which only one pair of test signals for use in the scan test (i.e., a scan test input signal-scan test output signal combination) has been left. In this case, in the first selection module 20 terminals, to which test signals, originally intended for use in the macro test, are applied (i.e., an input terminal S and an input terminal 1 of the first selector 21 and an input terminal S and an input terminal 1 of the second selector 22) are all coupled to ground. Accordingly, the first bidirectional I/O module 15 provides the first normal input signal NI1 to the combinational logic circuit 52, and in addition, provides the scan test input signal STI to the second bidirectional I/O module, not shown in the figure, when the first normal control signal S10 is in the state of "LOW". Further, the first bidirectional I/O module 15 provides the first normal output signal NO1 to the outside when the first normal control signal S10 is in the state of "HIGH". In the second bidirectional I/O module not shown in the figure, switching between the scan test and the normal operation is made by a test mode signal fed to each of the selectors. As a result, scan testing becomes executable on the combinational logic circuit 52.

As explained above, in accordance with the present embodiment stylized test units which each comprise two test modules are arranged in advance around the periphery of a chip in order to secure a signal route necessary for the scan test, macro test, and normal operation. Such arrangement makes it achievable to perform layout design of a semiconductor integrated circuit without having to laying out test units every time the number of functional units 50 is changed. Additionally, even when the scan test's bus bit-width differs from that of the macro test, connection processing of wires with respect to pre-formed test modules makes it possible to carry out layout design of a semiconductor integrated circuit by making use of the test modules. To sum up, by virtue of the commonization of I/O terminals for use in normal operation and I/O terminals for use in test operation and the use of stylized test units, the layout design of semiconductor integrated circuits becomes easy to carry out without an increase in chip area.

In the above-described embodiments, the functional macrocircuit 54 is implemented by a memory; however, any other functionally equivalent circuits, such as a DAC (digital-to-analog converter), may be employed instead.

The invention claimed is:

1. A semiconductor integrated circuit comprising:

a random logical circuit and a functional macrocircuit, said random logical circuit and said functional macrocircuit being connected together; and a test unit for performing a scan test on said random logical circuit according to an external scan test mode signal receivable from outside the test unit, and in addition, for performing a macro test on said functional macrocircuit according to an external macro test mode signal receivable from outside the test unit;

said test unit Including;

a first bidirectional input/output module for providing a macro test output signal received from said functional macrocircuit outside and for providing a scan test Input signal received from outside to said random logical circuit; and a second bidirectional Input/output module for providing a macro test Input signal received from outside to said functional macrocircuit and for providing a scan test output signal received from said random logical circuit to the outside, wherein said first bidirectional input/output module and second bidirectional input/output module provide signal routes for scan testing, macro testing and normally operating said random logical circuit and said functional macrocircuit.

2. The semiconductor Integrated circuit of claim 1, said first bidirectional Input/output module including:

a first selector for selecting between a first normal control signal received from said random logical circuit and said received macro test mode signal according to a received test mode signal, and in addition, for providing a signal thus selected;

a second selector for selecting between said received macro test output signal and a first normal output signal received from said random logical circuit according to said received test mode signal, and in addition, for provided a signal thus selected; and a first bidirectional driver for providing said scan test input signal to said random logical circuit, for providing said macro test output signal received from said second selector upon receipt of said macro test mode signal from said first selector, and for providing said first normal output signal received from said second selector outside upon receipt of said first normal control signal from said first selector;

said second biodirectional input/output module including:

a third selector for selecting between a second normal control signal received from said random logical circuit and said received scan test mode signal according to said received test mode signal, and in addition, for providing a signal thus selected:

a fourth selector for selecting between said received scan test output signal and a second normal output signal received from said random logical circuit according to said received test mode signal, and in addition, for providing a signal thus selected; and a second bidirectional driver for providing said macro test input signal to said functional macrocircuit, for providing said scan test output signal received from said fourth selector outside upon receipt of said scan test mode signal from said third selector, and for providing said second normal output signal received from said fourth selector upon receipt of said second normal control signal from said third selector.

3. The semiconductor integrated circuit of claim 2, wherein said test unit further includes a logical gate for providing, based on said scan and macro test mode signals, said test mode signal.

4. The semiconductor integrated circuit of claim 1, said random logical circuit including:

a combinational logic circuit; and a sequential circuit for providing said scan test input signal to said combinational logic circuit.

5. The semiconductor integrated circuit of claim 1, wherein said functional macrocircuit includes a memory.

6. The semiconductor integrated circuit of claim 2, wherein said test unit is placed in a peripheral region of a chip of said semiconductor integrated circuit.

* * * * *